(12) United States Patent
Kim

(10) Patent No.: US 7,193,911 B2
(45) Date of Patent: Mar. 20, 2007

(54) PAGE BUFFER FOR PREVENTING PROGRAM FAIL IN CHECK BOARD PROGRAM OF NON-VOLATILE MEMORY DEVICE

(75) Inventor: Eui Suk Kim, Kyoungki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/299,249

(22) Filed: Dec. 9, 2005

(65) Prior Publication Data

US 2006/0209601 A1     Sep. 21, 2006

(30) Foreign Application Priority Data

Mar. 15, 2005   (KR) ...................... 10-2005-0021483

(51) Int. Cl.
    *G11C 7/00*       (2006.01)

(52) U.S. Cl. .................. 365/194; 365/189.05

(58) Field of Classification Search ................ 365/194, 365/189.05, 185.17
    See application file for complete search history.

(56) References Cited

U.S. PATENT DOCUMENTS 5,982,663 A * 11/1999 Park ...................... 365/185.09
6,671,204 B2 * 12/2003 Im ......................... 365/185.12

* cited by examiner

*Primary Examiner*—Vu A. Le
(74) *Attorney, Agent, or Firm*—Townsend and Townsend and Crew LLP

(57) ABSTRACT

A page buffer in which the value of data that have been latched in a register of a page buffer is not changed by slowly transmitting data to the register in a check board program operation of a NAND flash memory device. The page buffer includes a first register having a first input unit for alternately receiving program data and erase data, and a second register having a second input unit for alternately receiving program data and erase data. Charge devices are respectively coupled to the first and second input units so that the program data or erase data are slowly input to the first or second input unit.

19 Claims, 3 Drawing Sheets

0: program data
1: erase data

PAGE BUFFER FOR PREVENTING PROGRAM FAIL IN CHECK BOARD PROGRAM OF NON-VOLATILE MEMORY DEVICE

BACKGROUND OF THE INVENTION

The present invention relates to a page buffer of a non-volatile memory device.

There is an increasing need for non-volatile memory devices which can be electrically programmed and erased, and do not need the refresh function of rewriting data on a predetermined cycle basis. Hereafter the term "program" refers to the operation of writing data into memory cells.

To achieve high integration of memory devices, NAND flash memory devices have been developed in which a plurality of memory cells are connected in series (i.e., a structure in which neighboring cells share the drain or source) to form one string. The NAND flash memory device is a memory device for sequentially reading information unlike a NOR type flash memory device.

In the NAND flash memory device, a page buffer is used to store a large quantity of information or read stored information within a short time period. The page buffer receives a large quantity of information from an I/O pad and provides the information to memory cells, or stores memory cell data and then outputs the data. The page buffer generally has a single register in order to temporarily store data. Recently, however, the page buffer employs a dual register to increase the program speed when programming a large quantity of data in a NAND flash memory device.

In the prior art, the capacity of devices was relatively small and a single-layered page buffer may be used. Recently, however, the capacity of devices has been increased significantly. Since the page buffer is laminated as shown in FIG. 1, the column line (Y-line) is lengthened to accommodate the increased capacity.

FIG. 1 schematically shows the construction of page buffers. FIG. 1 also shows that program data and erase data are alternately input in a check board program operation.

From FIG. 1, it can be seen that page buffers located close to a memory cell have longer column lines $Y_0$–$Y_N$.

At the time of a check board program, a data input transistor 12 of the page buffer is turned on according to a data input signal (nDI) in order to input program data. A data input transistor 11 is turned on according to a data input signal (DI) in order to input erase data.

If the column line (path) is lengthened, however, there occurs a problem in that program data "1" that have been latched in a node QAb of a latch circuit 110 of the page buffer are shifted to program data "0" through the data input transistor 12 that is turned on according to the data input signal (nDI) at the time of the check board program. This is because the data input transistor 11 is turned on too rapidly in order to input erase data (erase data indicated by "1" in FIG. 1 refer to the state of a cell, and the node QAb of the latch circuit 110 is input with "0" when erase data are input). That is, if the data input transistor 11 is turned on according to the data input signal (DI) in a state where data are not completely loaded onto the column line, program data "1" of the node QAb of the latch circuit 110 are discharged and then changed to program data "0".

As described above, if program data "1" that have been latched on the node QAb of the latch circuit 110 are shifted to program data "0", a "fail" state is generated at the time of the program operation of the memory cell.

BRIEF SUMMARY OF THE INVENTION

An advantage of the present invention is a page buffer in which the value of data that have been latched in a register of a page buffer is not changed by slowly transmitting data to the register at the time of a check board program of a NAND flash memory device. This improves the yield since the occurrence of fail during in the program operation of the NAND flash memory device is reduced.

In one embodiment, a non-volatile memory device includes a memory cell array; and a page buffer coupled to the memory cell array and including a first register having a first input unit to receive first program data, a second input unit to receive first erase data, a first delay component coupled to the first input unit, and a second delay component coupled to the second input unit. The first input unit is configured to transfer the first program data to a first node of the first register according to a first data input signal, and the second input unit is configured to transfer the first erase program to a second node of the first register according to a second data input signal. The first and second delay components are used to delay an input of the first and second data input signals, respectively, to the first and second input units, and provide an additional time to input the first program data and first erase data, respectively, into the first and second input units during a check board program operation.

In another embodiment, a page buffer of a non-volatile memory device includes a first register having a first input unit to receive program data according to a first data input signal that is received by the first input unit via a first data path and a second input unit to receive erase data according to a second data input signal that is received by the second input unit via a second data path. The first input unit transfers the program data to a first node of the first register according to the first data input signal, and the second input unit transfer the erase data to a second node of the first register according to the second data input signal. The first input unit is provided between a column line and the first node, and the second input unit is provided between the column line and the second node, the program data and erase data are input to the first and second input units, respectively, via the column line. The first data path is configured to be sufficiently long to delay an input of the first data input signal to the first input unit and provide an additional time to input the program data to the first input unit.

DETAILED DESCRIPTION OF THE INVENTION

The present invention will be described in connection with preferred embodiments with reference to the accompanying drawings.

Figure 1:
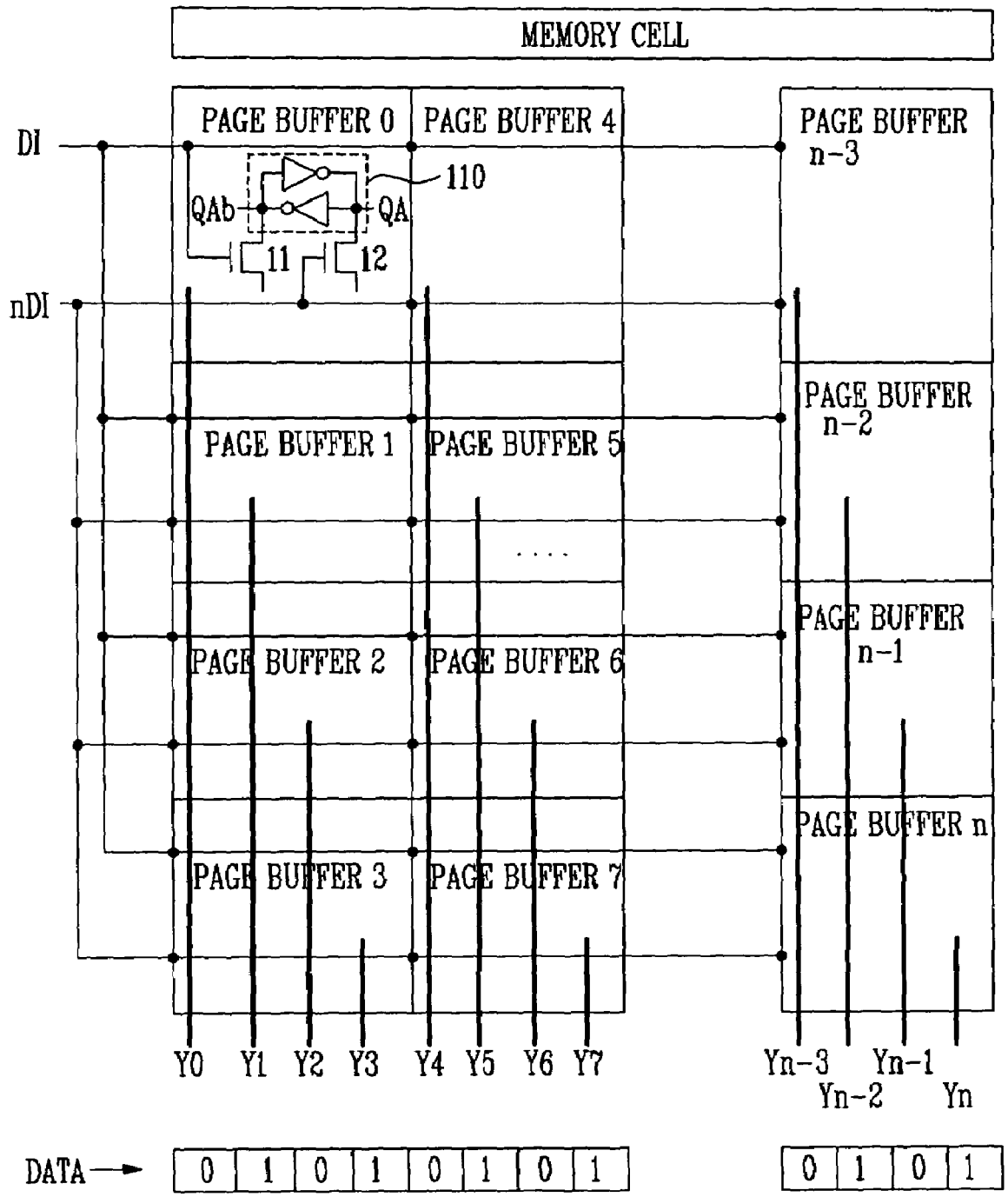
FIG. 1 is a block diagram of a conventional NAND flash memory device in which page buffers are accumulated.
Figure 2:
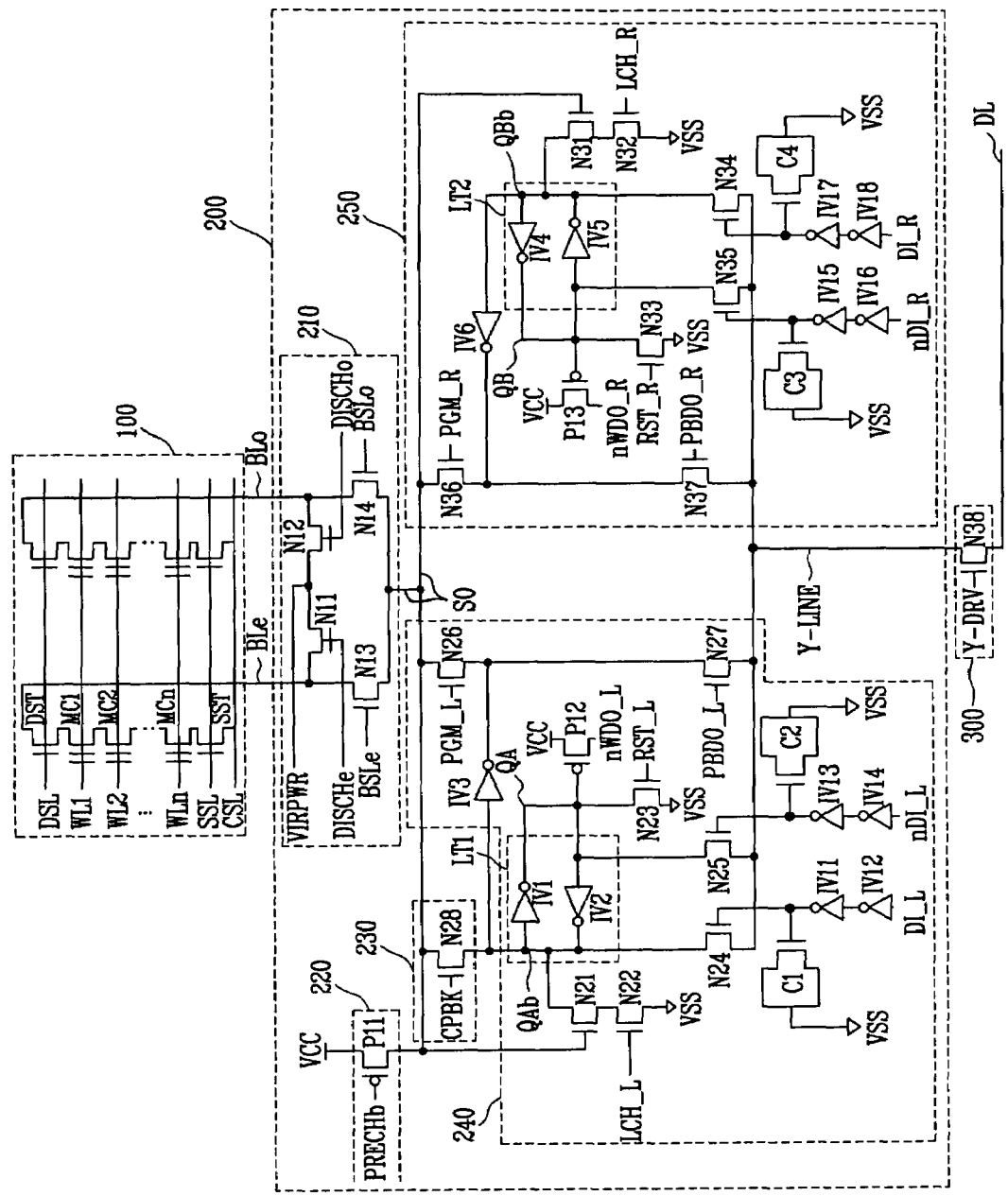
FIG. 2 is a circuit diagram of a NAND flash memory device according to one embodiment of the present invention.

FIG. 2 is a circuit diagram of a non-volatile memory device, e.g., NAND flash memory device, according to a preferred embodiment of the present invention. The NAND flash memory device includes a memory cell array 100, a page buffer 200, and a column select unit 300.

The memory cell array 100 includes memory cells $MC_0$ to MCn. The memory cells $MC_0$ to MCn are connected in series between a drain select transistor DST and a source select transistor SST to form cell strings. The drain select transistor DST is connected to each of bit lines BLe, BLo, and the source select transistor SST is connected to a common source line CSL. The bit line BLe indicates an even bit line, and the bit line BLo indicates an odd bit line. The memory cell (e.g., M1) is controlled by one word line such as WL1 and forms one page.

The page buffer 200 is provided between the memory cell array 100 and the column select unit 300, and includes a bit line select and bias unit 210, a precharge unit 220, a copyback program unit 230, a first register 240, and a second register 250. The even bit line BLe and the odd bit line BLo are connected to the page buffer 200 through a sensing line SO. The NAND device may include a plurality of page buffers. Only one page buffer 200 is shown in FIG. 2.

The bit line select and bias unit 210 includes bias supply transistors N11, N12 and bit line select transistors N13, N14. The bias supply transistor N11 has one end connected to the even bit line BLe, and the other end connected to a line for applying a bias signal (VIRPWR). The bias supply transistor N11 is turned on or off with a gate control signal (DISCHe). To program data into the cells associated with the even bit line BLe, the bias supply transistor N11 is turned on according to the gate control signal (DISCHe) and applies a power supply voltage (VCC) to the even bit line BLe as the bias signal (VIRPWR). The bias supply transistor N12 has one end connected to the odd bit line BLo, and the other end connected to a line for applying the bias signal (VIRPWR). The bias supply transistor N12 is turned on or off with a gate control signal (DISCHo). To program data into the cells associated with the odd bit line BLo, the bias supply transistor N12 is turned on according to the gate control signal (DISCHo) and applies the power supply voltage (VCC) to the odd bit line BLo as the bias signal (VIRPWR). The bit line select transistor N13 connects the even bit line BLe to the sensing line SO according to the bit line select signal (BSLe), and the bit line select transistor N14 connects the odd bit line BLo to the sensing line SO according to the bit line select signal (BSLo). As used herein, the term "data" refers to one or more bits of information.

The precharge unit 220 includes a PMOS transistor P11 connected between the power supply voltage (VCC) and the sensing line SO. The PMOS transistor P11 is turned on or off with a precharge signal (PRECHb). The PMOS transistor P11 precharges the sensing line SO with the power supply voltage (VCC) and supplies the current to the bit line BLe or BLo through the sensing line SO in a read operation.

The copyback program unit 230 includes an NMOS transistor N28 connected between the sensing line SO and the first register 240. The NMOS transistor N28 is turned on or off with a copyback signal (CPBK) at the time of a copyback program operation. At this time, the NMOS transistor N28 functions to connect the first register 240 and the sensing line SO in order to reprogram data of a cell that are stored in the first register 240 into another cell at the time of the copyback program operation.

The first register 240 includes a first latch circuit LT1, NMOS transistors N21, N22, a reset transistor N23, data input transistors N24, 25, inverters IV11 to IV14, delay capacitors C1, C2, an inverter IV3, a program transistor N26, a read transistor N27 and a verify transistor P12. The first latch circuit LT1 includes inverters IV1, IV2 and latches data read from the memory cell or data to be programmed. The NMOS transistor N21 is turned on or off according to a signal of the sensing line SO, and the NMOS transistor N22 is turned on or off according to a main latch signal (LCH_L). The NMOS transistor N22 is turned on when the NMOS transistor N21 is turned on, setting the node QAb of the first latch circuit LT1 to "0" and the node QA to "1". The reset transistor N23 is connected between a node QA of the first latch circuit LT1 and a ground voltage (VSS), and includes a NMOS transistor whose gate is applied with a reset signal (RST_L). The reset transistor N23 initializes the node QA of the first latch circuit LT1 to "0" and the node QAb to "1". The data input transistor N24 is connected between the node QAb of the first latch circuit LT1 and the column select unit 300 andis receives a data input signal (DI_L) as a control signal. The transistor N24 is an NMOS in the present embodiment. The data input transistor N25 is connected between the node QA of the first latch circuit LT1 and the column select unit 300 and receives a data input signal (nDI_L) as a control signal. The transistor N25 is an NMOS in the present embodiment. The data input transistors N24, N25 are turned on according to the data input signals (DI_L, nDI_L) and function to store program data or erase data received from an external source in the first latch circuit LT1. These data are received via a data line DL.

Figure 3A:
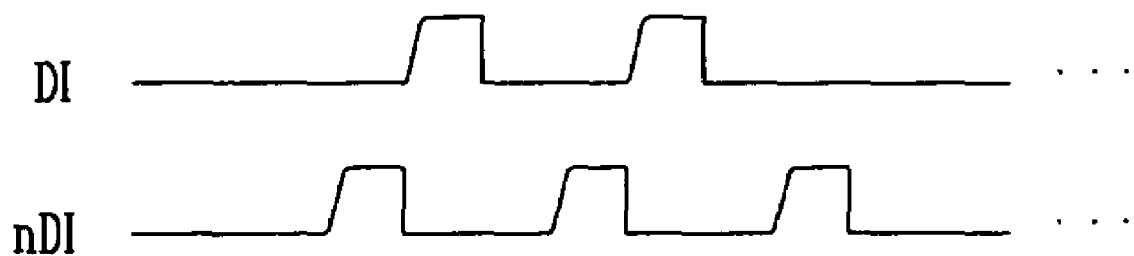
FIG. 3A are waveforms of data input signals used to drive data input transistors of a page buffer, where delay capacitors are not provided in a register.
Figure 3B:
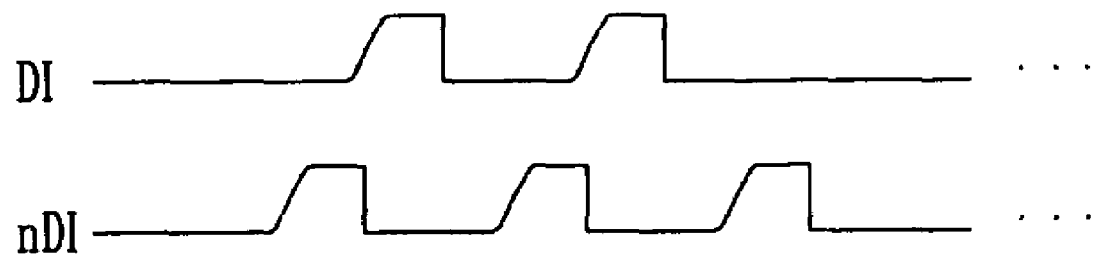
FIG. 3B shows pulse waveforms of data input signals used to drive data input transistor of a page buffer where delay capacitors are provided in a register.

The delay capacitors C1 and C2 are provided in order to make the waveforms of the data input signals (DI_L and nDI_L), as shown in FIG. 3B, i.e., in order to slowly turn on the data input transistors N24 and N25. These capacitors are configured to delay the data input signals (DI_L and nDI_L) being applied to the data input transistors N24, N25, so that the program or erase data to be stored in the latch circuit LT1 is delayed. The size of the capacitors C1 and C2 can be adjusted to obtain a desired delay time, i.e., a bigger capacitor can be used to lengthen the delay time and a smaller capacitor is used to shorten the delay time. FIG. 3A shows pulse waveforms of the data input signals (DI, nDI) when delay capacitors C1 and C2 are not provided in the first register. FIG. 3B shows pulse waveforms of the data input signals (DI, nDI) when the delay capacitors are provided in the first register.

The inverters IV11 and IV12 buffer the data input signal (DI_L) and output it after a given delay. The inverters IV13 and IV14 buffer the data input signal (nDI_L) and output it after a given. The inverter IV3 inverts a signal of the node QAb of the first latch circuit LT1. The program transistor N26 is connected between the sensing line SO and the output terminal of the inverter IV3, and includes an NMOS transistor whose gate is applied with a program signal (PGM_L). The program transistor N26 transmits program data or erase data, i.e., an output signal of the inverter IV3 to the bit line BLe or BLo through the sensing line SO. The read transistor N27 is connected between the output terminal of the inverter IV3 and the column select unit 300 and includes an NMOS transistor whose gate is applied with a read signal (PB-DO_L). The read transistor N27 transmits data output from the memory cell, i.e., an output signal of the inverter IV3 to the data line DL through the column select unit 300. The verify transistor P12 is connected between the power supply voltage (VCC) and a node nWDO_L and includes a PMOS transistor, the gate of which is applied with a signal of the node QA of the first latch circuit LT1. The verify transistor P12 functions to verify program or erase, and verifies pass or fail of program or erase by reading a signal received from the node QA of the first latch circuit LT1.

The second register 250 includes a second latch circuit LT2, NMOS transistors N31 and N32, a reset transistor N33, data input transistors N34 and 35, inverters IV15–IV18, delay capacitors C3 and C4, an inverter IV6, a program transistor N36, a read transistor N37 and a verify transistor P13. These elements perform similar functions as the corresponding elements in the first register 240.

The column select unit 300 includes an NMOS transistor N38 controlled according to a column select signal (Y-DRV). The NMOS transistor N38 functions to connect the page buffer 200 and the data line DL. The column select signal (Y-DRV) is generated by a column address.

As described above, the first and second registers 240, 250 of the page buffer selectively operate at the time of the program, read and verify operations. For example, if the first register 240 is activated to perform the program, read and verify operations, the second register 250 is deactivated. If the second register 250 is activated to perform the program, read and verify operations are performed, the first register 240 is deactivated.

According to the present embodiment, a voltage level of program data of the node QAb or the node QBb of the latch circuit LT1 or LT2 is not changed by slowly turning on the data input transistors N24 and N25 (or N34 and N35). That is, program data or erase data are slowly transferred to the latch circuit LT1 or LT23B.

A case where the first register 240 is activated will be described below as an example. The data input transistor N25 is turned on according to the data input signal (nDI_L) and program data are input to the first latch circuit LT1 of the page buffer. The data input transistor N24 is then turned on according to the data input signal (DI_L) and erase data are input to the first latch circuit LT1 of the page buffer. In this manner, the program operation performed by alternately inputting program data and erase data is referred to as a check board program.

In this case, the erase data and program data input to the first latch circuit LT1 of the page buffer are all "0". To be more specific, if the data input transistor N25 is turned on according to the data input signal (nDI_L), the node QA of the first latch circuit LT1 is input with program data "0" and the bit line BLe or BLo is input with "0". On the other hand, if the data input transistor N24 is turned on according to the data input signal (DI_L), the node QAb of the first latch circuit LT1 is input with erase data "0" and the bit line BLe or BLo is input with "1" through the inverter IV3.

In the check board program operation, if the data input transistor N25 is turned on according to the data input signal (nDI_L) and program data are input to the node QA of the first latch circuit LT1, the node QA of the first latch circuit LT1 latches "0" and the node QAb thereof latches "1". Accordingly, the column select transistor N38 is turned off and the Y-line is floated. Thereafter, in order to input erase data "0" to the node QAb of the first latch circuit LT1, the data input transistor N24 is turned on using the data input signal (DI_L). The capacitor C1 is coupled to the line to which the data input signal (DI_LL) is input, as shown in FIG. 2, so that the transistor N24 would turn on slowly according to the delayed data input signal (DI) shown in FIG. 3B. The delayed data input signal (DI) is a delayed waveform of the data input signal (DI_L) inputted to the inverter IV12. As a result of the delay, the time required to load the erase data onto the Y-line is increased. Consequently, sufficient time is provided to completely load the data into the Y-line even if the Y-line is lengthened. Thus, the value of the node QAb and the node QB of the first latch circuit LT1 would not be changed. The capacitor C2 coupled to the transistor N25 provides a similar delay with respect to the data input signal (nDL-L).

Another method of slowly turning on the data input transistors N24, N25 is to lengthen a line to which the data input signals (DI, nDI) are input so that the data input signals (DI, nDI) are slowly input to the latch circuit LT1 or LT2 as shown in FIG. 3A rather than using capacitors C1 and C2. As shown in FIGS. 3A and 3B, delay time, where capacitors C1 and C2 are used, is identical to delay time, where a line to which data input signal are input, is lengthen.

For example, for a 1G device, the metal 1 is used as the line to which the data input signals (DI, nDI) are input to the latch circuit. The line is provided to be about 200 µm. Such a line may be used to apply the data input signals (DI, nDI) to 256 page buffers.

If the number of page buffers used is less, the data input signal line needs to be lengthened. On the other hand, if the number of page buffers used is more, the data input signal line needs to be shortened. For example, if 64 page buffers are, the data input signal line needs to be about 800 µm.

Although the foregoing description has been made with reference to specific embodiments, it is to be understood that changes and modifications of the above specific embodiments may be made by the ordinary skilled in the art without departing from the spirit and scope of the present invention. For example, an inverter may be added along the path used to input the data input signal to the NMOS transistor 24, 25 rather than using a delay capacitor. The scope of the invention is defined using the appended claims.

What is claimed is:

1. A non-volatile memory device, comprising:
    a memory cell array; and
    a page buffer coupled to the memory cell array and including a first register having a first input unit to receive first program data, a second input unit to receive first erase data, a first delay component coupled to the first input unit, and a second delay component coupled to the second input unit,
    wherein the first input unit is configured to transfer the first program data to a first node of the first register according to a first data input signal, and the second input unit is configured to transfer the first erase program to a second node of the first register according to a second data input signal,
    wherein the first and second delay components are used to delay an input of the first and second data input signals, respectively, to the first and second input units, and provide an additional time to input the first program data and first erase data, respectively, into the first and second input units during a check board program operation.

2. The device as claimed in claim 1, wherein the first input unit receives the first data input signal via a first data path, wherein the first delay component is coupled to the first data path.

3. The device as claimed in claim 2, wherein the first input unit comprises a first transistor provided between the first node of the first register and a column line, the first transistor having a gate that is configured to receive the first data input signal via the first data path.

4. The device as claimed in claim 3, wherein the second input unit receives the second data input signal via a second data path, wherein the second delay component is coupled to the second data path.

5. The device as claimed in claim 4, wherein the second input unit comprises a second transistor provided between the second node of the first register and the column line, the second transistor having a gate that is configured to receive the second data input signal via the second data path.

6. The device as claimed in claim 1, wherein the page buffer further comprises a second register having a third input unit to receive second program data, and a fourth input unit to receive second erase data, wherein third and fourth delay components are coupled to the third and the fourth input units, respectively.

7. The device as claimed in claim 6, wherein the third input unit transfers the second program data to a third node of the second register according to a third data input signal that is input to the third input unit via a third data path, wherein the third delay component is provided along the third data path.

8. The device as claimed in claim 7, wherein the third input unit comprises a third transistor provided between the third node of the second register and a column line.

9. The device as claimed in claim 6, wherein the fourth input unit transfers the second erase data to a fourth node of the second register according to a fourth data input signal that is received via a fourth data path, wherein the fourth delay component is provided along the fourth data path.

10. The device as claimed in claim 9, wherein the fourth input unit comprises a fourth transistor provided between the second node of the second register and a column line.

11. The device as claimed in claim 6, wherein the third delay component includes at least one capacitor.

12. The device as claimed in claim 1, wherein the first delay component includes at least one capacitor.

13. The device as claimed in claim 4, wherein the first node and second node are configured to be in different binary states, the program data being input to the first input unit via the column line.

14. The device as claimed in claim 4, wherein the page buffer further comprises a latch coupled to the first and second input units.

15. The device as claimed in claim 4, further comprising:
another page buffer having a second register having a third input unit to receive second program data and a fourth input unit to receive second erase data,
wherein the third input unit transfers the second program data to a third node of the second register according to a third data input signal, the third input unit receiving the third data input signal via a third data path, the third data path being shorter than the first data path by a given length,
wherein the first delay component comprises the given length of the first data path by which the first data path is longer than the third data path.

16. A page buffer of a non-volatile memory device, comprising:
a first register having a first input unit to receive program data according to a first data input signal that is received by the first input unit via a first data path and a second input unit to receive erase data according to a second data input signal that is received by the second input unit via a second data path,
wherein the first input unit transfers the program data to a first node of the first register according to the first data input signal, and the second input unit transfer the erase data to a second node of the first register according to the second data input signal,
wherein the first input unit is provided between a column line and the first node, and the second input unit is provided between the column line and the second node, the program data and erase data are input to the first and second input units, respectively, via the column line,
wherein the first data path is configured to be sufficiently long to delay an input of the first data input signal to the first input unit and provide an additional time to input the program data to the first input unit.

17. The page buffer as claimed in claim 16, wherein the first data path is formed using metal 1.

18. The page buffer as claimed in claim 16, further comprising a second register having a third input unit to receive program data according to a third data input signal and a fourth input unit to receive erase data according to a fourth data input signal,
wherein a data path from which the third data input signal is input to the third input unit is configured to be sufficiently long to delay an input of third data input signal to the third input unit.

19. The page buffer as claimed in claim 13, wherein the data path associated with the third input unit is defined by metal 1.

* * * * *